US012646646B2

(12) United States Patent　　　(10) Patent No.:　US 12,646,646 B2
Bura et al.　　　　　　　　　　　(45) Date of Patent:　Jun. 2, 2026

(54) MAGNETIC COMPONENT FOR AN ELECTRICAL AND/OR ELECTRONIC MODULE

(71) Applicant: Robert Bosch GmbH, Stuttgart (DE)

(72) Inventors: Dennis Bura, Renningen (DE); Thomas Plum, Cologne (DE)

(73) Assignee: Robert Bosch GmbH, Stuttgart (DE)

( * ) Notice: Subject to any disclaimer, the term of this patent is extended or adjusted under 35 U.S.C. 154(b) by 694 days.

(21) Appl. No.: 18/042,234

(22) PCT Filed: Jul. 19, 2021

(86) PCT No.: PCT/EP2021/070146
§ 371 (c)(1),
(2) Date: Feb. 20, 2023

(87) PCT Pub. No.: WO2022/037871
PCT Pub. Date: Feb. 24, 2022

(65) Prior Publication Data
US 2024/0029938 A1　　　Jan. 25, 2024

(30) Foreign Application Priority Data

Aug. 20, 2020　(DE) .................... 10 2020 210 580.4

(51) Int. Cl.
*H01F 27/24*　　　(2006.01)
*H01F 27/28*　　　(2006.01)
*H03H 1/00*　　　(2006.01)

(52) U.S. Cl.
CPC ............. *H01F 27/24* (2013.01); *H01F 27/28* (2013.01); *H03H 1/0007* (2013.01)

(58) Field of Classification Search
CPC ........ H01F 27/24; H01F 27/28; H03H 1/0007

USPC ......... 333/181; 336/173, 180, 181, 183, 220
See application file for complete search history.

(56)　　　　　References Cited

U.S. PATENT DOCUMENTS 3,988,541 A * 10/1976 Boast ....................... H04R 3/08
　　　　　　　　　　　　　　　　　　381/98
2006/0077030 A1* 4/2006 Herzer ................... B82Y 25/00
　　　　　　　　　　　　　　　　　　336/221
2017/0089986 A1 3/2017 Hamberger et al.

FOREIGN PATENT DOCUMENTS

CH　　　701847 A2　3/2011
CH　　　704267 B1　3/2015
JP　　　S5212417 A　1/1977
JP　　　H1038986 A　2/1998
JP　　　H10233316 A　9/1998
JP　　　2010127889 A　6/2010
(Continued)

OTHER PUBLICATIONS

Translation of International Search Report for Application No. PCT/EP2021/070146 dated Nov. 8, 2021 (2 pages).

*Primary Examiner* — Rakesh B Patel
(74) *Attorney, Agent, or Firm* — Michael Best & Friedrich LLP

(57)　　　　　ABSTRACT

The invention proposes a magnetic component (1) for an electrical and/or electronic module, wherein the magnetic component (1) comprises a magnetic core (10) and an electrical conductor (6) surrounding the magnetic core (10), wherein a bridge element (20) is arranged on the magnetic core (10), wherein at least a part of the bridge element (20) is surrounded by an electrical measuring conductor (30), wherein the electrical measuring conductor (30) is designed to measure a zero current in the electrical conductor (6) surrounding the magnetic core (10).

15 Claims, 6 Drawing Sheets

(56) References Cited

FOREIGN PATENT DOCUMENTS

| JP | 2013044543 | A | 3/2013 |
| WO | 2010041340 | A1 | 4/2010 |

* cited by examiner

MAGNETIC COMPONENT FOR AN ELECTRICAL AND/OR ELECTRONIC MODULE

BACKGROUND OF THE INVENTION

The present invention relates to a magnetic component for an electrical and/or electronic module.

Modern switching power supplies, for example power factor correction stages or PFC stages, operate at high switching frequencies of a few 100 kHz in order to reduce the size of the passive components. In order to ensure high efficiency at the same time, the power semiconductors are turned on softly. The term "zero voltage switching" (ZVS) is used. The regulation of such systems while ensuring the ZVS presents a major technical challenge.

Here, the "zero current detection" (ZCD) of the reacting current in order to meet both requirements simultaneously proves particularly helpful. Conventional current measuring methods such as current measuring shunts can only be used with great restrictions for this purpose due to the low measurement voltages and the interferences present.

CH 701847 A2 discloses an alternative approach for the zero current detection. A highly permeable core is wound with two coils. This is the useful current to be measured on the one hand and a sense coil on the other hand. In the region of the zero current, the core is not saturated and the component behaves like a classic transformer, i.e. a translated output voltage is detected on the sense coil. As soon as the current in the load circuit increases, the core material saturates and the voltage on the sense coil breaks down. A signal with very high interference immunity can be generated via this pulse in the region of the zero current. A suitable evaluation circuit allows this pulse to be further processed directly in the control hardware.

SUMMARY OF THE INVENTION

According to the invention, a magnetic component for an electrical and/or electronic module is proposed. The magnetic component comprises a magnetic core and an electrical conductor surrounding the magnetic core. According to the invention, a bridge element is arranged on the magnetic core, wherein at least a part of the bridge element is surrounded by an electrical measuring conductor, wherein the electrical measuring conductor is designed to measure a zero current in the electrical conductor surrounding the magnetic core.

Compared to the prior art, the magnetic component according to the invention has the advantage that no separate component is required for measuring the zero current, which must comprise two galvanically isolated coils. Instead of constructing a ZCD transformer as a separate component, it is integrated into the magnetic component already available, for example into a choke or a transformer. For this purpose, an air gap of the magnetic component, which can be designed for example as a choke or a transformer, is bridged with a highly permeable bridge element. An electrical measuring conductor, a so-called sense coil, is wound around the highly permeable bridge element. The air gap of the magnetic core can be a discrete gap in the magnetic core of the magnetic component through which the magnetic core is interrupted. However, the air gap can also be a non-discrete, so-called distributed air gap. For small load currents, the magnetic flux at least partially flows via the bridge element and not via the air gap. By changing the magnetic flux in the bridge element, a voltage in the electrical measuring conductor is induced in this phase. A characteristic voltage peak results in the zero current. If the magnetic flux is greater, the bridge element saturates and the magnetic flux flows across the air gap of the magnetic core. As a result, there is only little or no further change in the magnetic flux in the bridge element and no or very little voltage is induced in the electrical measuring conductor. The zero current can be detected as the voltage peak on the electrical measuring conductor. The voltage signal induced in the electrical measuring conductor of the control unit of the electronics can be transmitted by means of a suitable evaluation circuit.

The magnetic component according to the invention represents an advantageously compact component in which the electrical measuring conductor is integrated to detect the zero current. Due to the integration of the electrical measuring conductor into the magnetic component according to the invention, no additional coil of the electrical conductor is required. The added bridge element has only a very low volume, so that the required design space and costs are significantly reduced.

Furthermore, the magnetic component according to the invention is advantageously efficient, because core losses are significantly reduced compared to the prior art. Due to the magnetic component according to the invention, high core losses, which are incurred in particular in modern PFC stages, are advantageously avoided. The PFC stages are operated at very high switching frequencies, and at the same time the material is operated bidirectionally up to deep saturation. The core losses reduced in comparison to the prior art result in less heat in the magnetic component, so that advantageously less heat must be dissipated from the magnetic component, and thus a smaller overall design space is required.

According to an advantageous embodiment example, it is provided that the material of the bridge element has a relative magnetic permeability count of more than 500, in particular of more than 1000, in particular of more than 2000. By means of such a highly permeable bridge element, the air gap of the magnetic component can advantageously be well bridged by the bridge element, such that, at small load currents in the electrical conductor, the magnetic flux flows through the bridge element and does not flow through the air gap of the magnetic component. Thus, in this phase, a voltage in the electrical measuring conductor (sense coil) is also induced. The voltage peak characteristic for the zero current is obtained. If the magnetic flux is greater, the bridge element saturates, and the magnetic flux flows across the air gap. As a result, no or only low voltage is induced in the electrical measuring conductor (sense coil).

According to an advantageous embodiment example, it is provided that the magnetic core has an axial direction and a central annular opening, and a first annular surface and a second annular surface facing away from the first annular surface are formed on the magnetic core.

According to an advantageous embodiment example, it is provided that at least one gap is formed in the magnetic core, wherein the gap in the magnetic core is bridged by means of the bridge element, wherein the electrical measuring conductor surrounds at least a part of the bridge element in the region of the gap. The electrical measuring conductor can be advantageously well arranged in the region of the gap and can at least partially extend in the gap. Due to the discrete gap in the magnetic core, a simple flat slide or film can be used as a bridge element, which can be placed on the magnetic core across the gap. The gap can then provide sufficient space for one or more coils of the electrical measuring wire around the bridge element. At the same time, the contact of the bridge element with the magnetic core is retained on both sides of the gap.

According to an advantageous embodiment example, it is provided that the gap extends in the axial direction and in a radial direction perpendicular to the axial direction.

According to an advantageous embodiment example, it is provided that the bridge element is arranged on the magnetic core on the first annular surface of the magnetic core, in particular on the first annular surface of the magnetic core. The bridge element can, for example, be advantageously well adapted to the first annular surface and can abut it over a large surface area, so that an advantageously large surface area contact is made between the magnetic core and the bridge element.

According to an advantageous embodiment example, it is provided that the bridge element is designed as a film or as a slide. A bridge element designed in this way represents an advantageously simple and inexpensive component that is suitable for the zero current detection.

According to an advantageous embodiment example, it is provided that a recess is formed in the bridge element in the region of the gap, wherein the electrical measuring conductor extends through the recess in the bridge element. Thus, the bridge element is advantageously tapered in the region of the recess. For example, the recess divides the bridge element into two webs. The electrical measuring conductor is wound around one of the webs and, in so doing, passes through the recess in the bridge element and thus forms the sense coil for the zero current detection. The second web can merely serve for mechanical stability and has no electromagnetic function.

According to an advantageous embodiment, it is provided that the bridge element is tapered in the region where it is surrounded by the electrical measuring conductor. The degree of tapering of the bridge element, together with the number of winding turns of the electrical measuring conductor, can adjust how large the resulting voltage signal will be on the measuring conductor and how wide the pulse will be. Due to a tapered bridge element, an advantageously narrow signal can be generated in the measuring conductor, and the zero current is thus advantageously precisely determined.

According to an advantageous embodiment, it is provided that the magnetic component further comprises a further electrical conductor surrounding the magnetic core, wherein the magnetic core, together with the electrical conductor and the further electrical conductor, forms a transformer. Thus, advantageously, the zero current of the magnetization current can also be determined on a transformer by means of the measuring conductor. The magnetic core thus comprises more than one load-bearing coil, namely at least one second electrical conductor adjacent to the first electrical conductor. Furthermore, in suitable topologies, this can offer advantages in the ZVS and in the control.

BRIEF DESCRIPTION OF THE DRAWINGS

An embodiment example of the invention is shown in the drawings and explained in further detail in the following description. The figures show.

DETAILED DESCRIPTION

Figure 1:
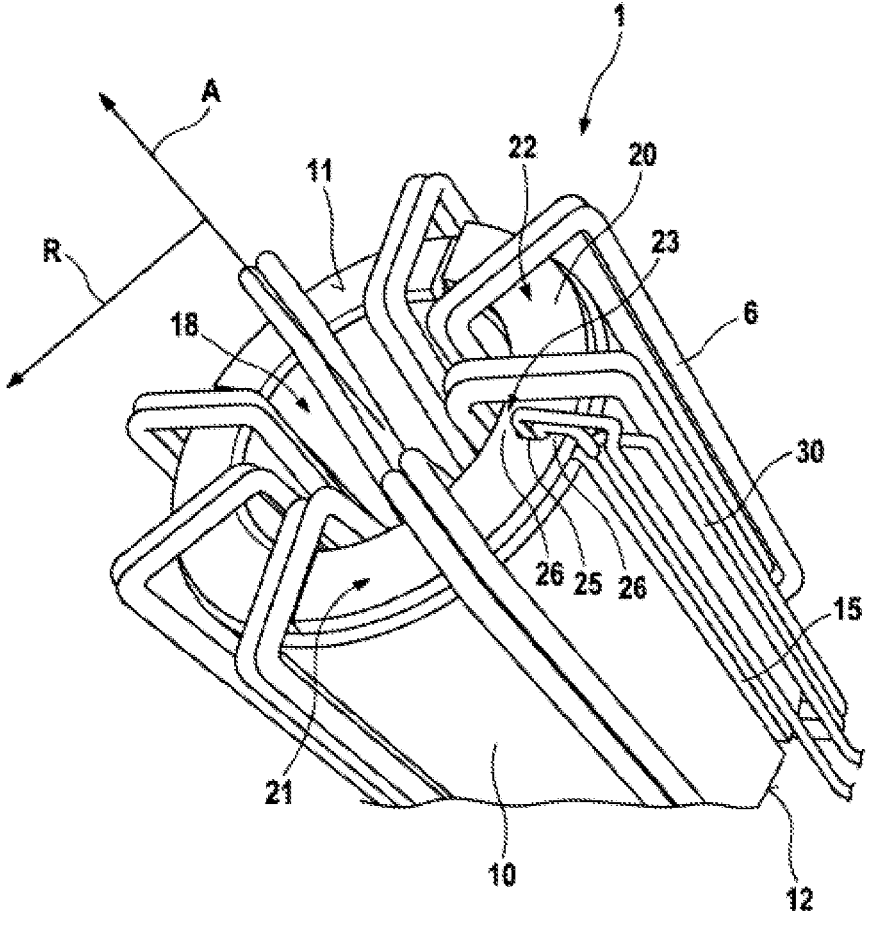
FIG. 1 a view of an embodiment example of the magnetic component.
Figure 2:
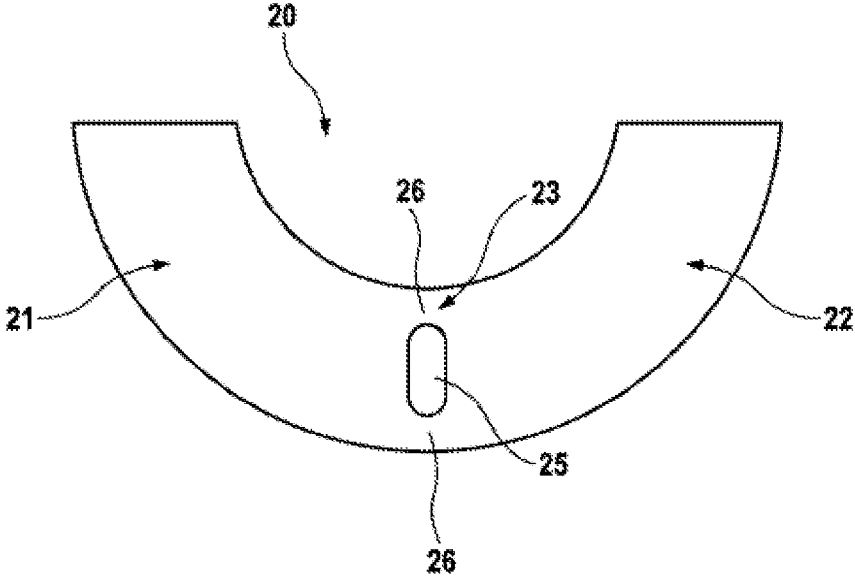
FIG. 2 a plan view of the bridge element of the embodiment example of the magnetic component, FIG. 3 a longitudinal section through the embodiment example of the magnetic component of a plane parallel to the axial direction, FIG. 4 a cross-section through the embodiment example of the magnetic component in a plane perpendicular to the axial direction at the height of the magnetic core, FIG. 5 a further cross-section through the embodiment example of the magnetic component in a plane perpendicular to the axial direction at the height of the bridge element, FIG. 6 an exemplary measurement curve of the measurement of the zero current on the magnetic component 1.
Figure 3:
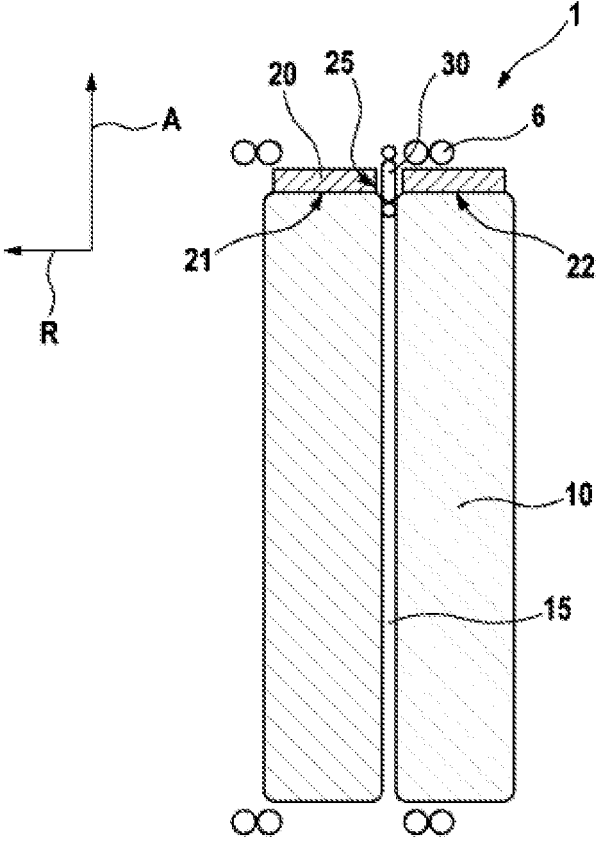
Figure 4:
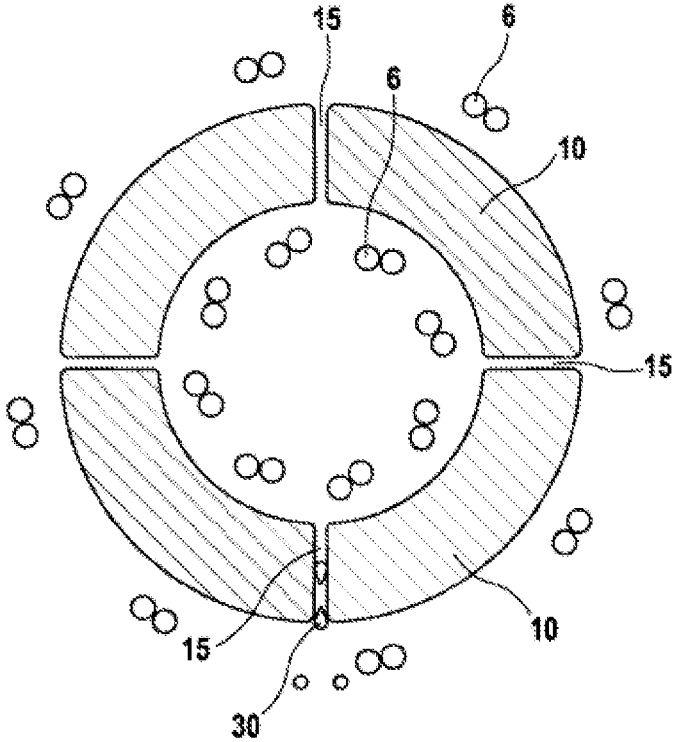
Figure 5:
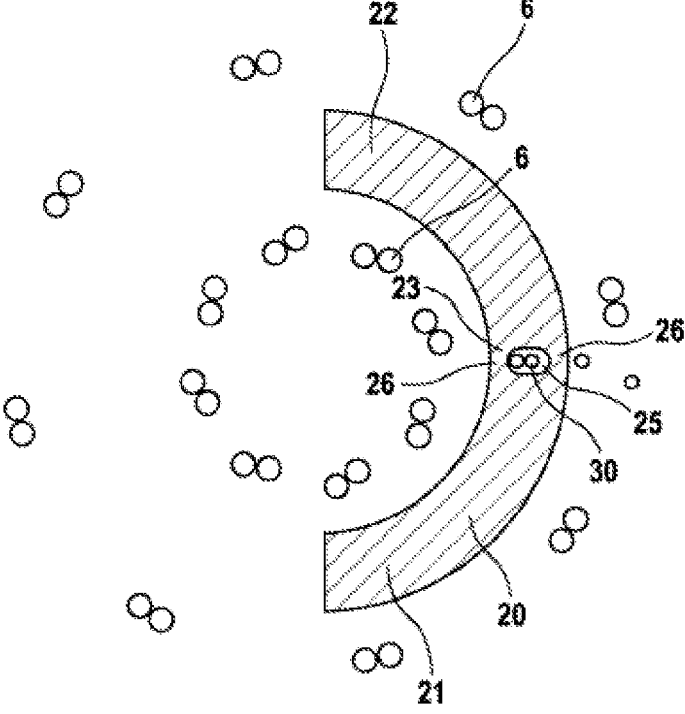

FIGS. 1 to 5 show an embodiment example of the magnetic component 1. The magnetic component 1 comprises a magnetic core 10 and at least one electrical conductor 6 surrounding the magnetic core 10. The conductor 6 is wound around the magnetic core 10. If an electrical conductor 6 is wound around the magnetic core 10, the magnetic component 1 can be a choke. In addition to the electrical conductor 6, the magnetic component 1 can comprise a further electrical conductor that surrounds the magnetic core 10, which is not shown in the figures. The further electrical conductor can be wound onto the magnetic core 10. If a further electrical conductor is provided in addition to the first electrical conductor 6, the magnetic component 1 can be designed as a transformer.

The magnetic core 10 is designed in the form of a ring or toroid, for example. The ring can be designed as an annular ring as in the embodiment example. However, the ring can also be designed as a square ring, for example. The magnetic core 10 has an axial direction A. The magnetic core 10 has a central annular opening 18. A first annular surface 11 and a second annular surface 12 are formed on the magnetic core 10. The first annular surface 11 faces away from the second annular surface 12. The annular surfaces 11, 12 extend annularly around the central annular opening 18. In the embodiment example shown in the figures, the annular surfaces 11, 12 are interrupted by four columns 15. The annular surfaces 11, 12 thus do not completely surround the central annular opening 18, but rather have interruptions at the columns 15. The annular surfaces 11, 12 are spaced apart in the axial direction A by a height of the magnetic core 10. The annular surfaces 11, 12 are planar in this embodiment example and are designed so as to be plane-parallel to one another, for example. The annular surfaces 11, 12 are congruent with one another. The annular surfaces 11, 12 delimit the toroid-shaped magnetic core 10 in the axial direction A.

The magnetic core 10 can be formed from ferrite, for example, as a cut strip-wound core or an iron sheet. The magnetic core 10 has a low effective permeability. As shown in the figures, the permeability of the magnetic core 10 can be reduced by one or more discrete gaps 15. The gaps 15 in the magnetic core 10 form air gaps of the magnetic core 10, which reduce the permeability of the magnetic core 10. In the embodiment example shown in the figures, four gaps 15 are formed in the magnetic core 10. The gaps 15 interrupt the magnetic core 10. In this embodiment example, the gaps 15 extend laminarly in the axial direction A and in a radial direction R perpendicular to the axial direction A, respectively.

However, the permeability of the magnetic core 10 can also be reduced, for example by a so-called distributed air gap, which is not designed as a discrete gap 15 in the magnetic core 10, as in the embodiment example shown in the figures. In such a distributed air gap magnetic core 10, the permeability is intrinsically low. Such a magnetic core 10 can for example be formed as a powder core consisting of a plurality of separate ferromagnetic particles and thus forming a distributed air gap. For example, the distributed air gap magnetic core can be formed from Sendust, MPP, carbonyl iron powder, or iron powder.

In addition to the magnetic core 10, the magnetic component 1 further comprises an electrical conductor 6. The electrical conductor 6 is wound on the magnetic core 10, for example, and thereby surrounds the magnetic core 10 in one or more winding turns. The electrical conductor 6, together with the magnetic core 10, can for example form a toroid coil, which is also referred to, for example, as an annular ring coil or a ring coil. The electrical conductor 6 is designed as an electrically conductive wire, for example as an insulated copper wire. The current flows through the electrical conductor 6, whose zero current is determined by means of a bridge element 20 and the electrical measuring conductor 30. The zero current refers to the time at which the current $I_L$ changes sign due to the electrical conductor 6. A zero position with a sign change in current $I_L$ is thus referred to as a zero current.

Furthermore, the magnetic component 1 can comprise a further electrical conductor (not shown in the figures) in addition to the electrical conductor 6. The further electrical conductor can, for example, also be wound on the magnetic core 10 and can thereby surround the magnetic core 10 in one or more winding turns. The further electrical conductor is also designed as an electrically conductive wire, for example as an insulated copper wire. The magnetic core 10, the electrical conductor 6, and the further electrical conductor can together form a transformer.

As shown in FIG. 1, the magnetic component 1 further comprises the bridge element 20 and an electrical measuring conductor 3. In the embodiment example, the electrical measuring conductor 30 surrounds a part of the bridge element 20. The electrical measuring conductor 30 is wound around the part of the bridge element 20. In this embodiment, the electrical measuring conductor 30 surrounds the part of the bridge element 20 in a coil. However, the electrical measuring conductor 30 can also surround the part of the bridge element 20 in multiple coils. If the magnetic flux in the bridge element 20 changes, a voltage is induced in the electrical measuring conductor 30.

The bridge element 20 is arranged on the magnetic core 10. The bridge element 30 abuts the magnetic core 10, for example, directly or indirectly. The bridge element 20 provides an additional flux path for the magnetic flux and thus bridges the air gap of the magnetic core 10. The bridge element 20 thus forms a flux bypass for the magnetic flux, which forms at a load current in the electrical lead 6. The bridge element 20 has a high permeability, so that the air gap of the magnetic core 10 can be bridged by means of the bridge element 20. For this purpose, the bridge element 20 is formed from a material having a relative magnetic permeability count of more than 500, in particular of more than 1000, preferably in particular of more than 2000. For example, the bridge element 20 can be formed from ferrite.

The bridge element 20 can be designed as a film, for example, or as a small plate. Typically, the cross-section of the bridge element 20 is small compared to the cross-section of the magnetic core 10. For example, the thickness of the bridge element 20 in the axial direction A can be less than 1.5 mm, for example 1 mm. The geometrical dimensions of the bridge element 20 must ensure a suitable mechanical stability. Due to the cross-sectional surface of the part of the bridge element 20 surrounded by the electrical measuring conductor 30, together with the number of winding turns of the electrical measuring conductor 30, it can be adjusted how large the resulting voltage signal on the electrical measuring conductor 30 will be and how wide the pulse will be.

In the embodiment example shown in the figures, at least one gap 15 is formed in the annular core 10. The bridge element 20 is arranged on the magnetic core 10 such that the gap 15 in the annular core 10 is bridged by the bridge element 20. In this embodiment, the bridge element 20 comprises a first contact region 21, a second contact region 22, and a bridge region 23 arranged between the first contact region 21 and the second contact region 22. The first contact region 21 and the second contact region 22 rest on the magnetic core 10. The bridge region 23 of the bridge element 20 is arranged in the region of the gap 15 and does not rest on the magnetic core 20. The bridge region 23 of the bridge element 20 extends from the first contact region 21 over the gap 15 to the second contact region 22. The bridge element 20 thus connects the two sub-regions of the magnetic core 10 separated by the gap 15. For example, the bridge element 20 extends in a direction perpendicular to the radial direction R and perpendicular to the axial direction A across the gap 15.

The shape of the bridge element 20 can be adapted to the shape of the magnetic core 10, as in the embodiment example shown in the figures. In this embodiment example with a magnetic core having annular surfaces 11, 12, the bridge element 20 is also designed in the form of an annular segment. Thus, the bridge element 20 can advantageously well abut the magnetic core 10, for example on the first annular surface 11, and the contact regions 21, 22 of the bridge element are in extensive contact with the first annular surface 11.

As shown in the figures, the bridge element 20 can be tapered in the region in which it bridges the gap 15. The bridge region 23 thus has a tapered cross-section compared to the first contact region 21 and/or the second contact region 22. The bridge element 20 is arranged on the magnetic core 10 such that region having the cross-sectional taper lies exactly above the gap 15.

In this embodiment example, a recess 25 is formed in the bridge element 20. The recess 25 extends in the axial direction A through the bridge element 20. The recess 25 separates the bridge region 23 of the bridge element 20 into two webs 26. The electrical measuring conductor 30 extends through the recess 25. In this embodiment example, the measuring conductor 30 extends through the recess 25 such that the electrical measuring conductor 30 is wound around one of the webs 26 and thus surrounds it. The bridge element 20 can comprise multiple recesses 25 and ridges 26. However, the bridge element 20 can also comprise no recess 25.

In the embodiment example shown in the figures, the bridge element 20 is arranged on the first annular surface 11 of the magnetic core 10. The arrangement of the bridge element 20 and thus of the additional flux path can in principle be done on all sides of the magnetic core 10. It must only be ensured that the impedance of the additional path formed by the bridge element is of the magnitude of the air gap impedance. This ensures that a substantial proportion of the current flows over the additional path in the bridge element 20 in case of small flows and can thus generate a significant signal.

The magnetic core 10 and the bridge element 20 can be manufactured in the same operation, for example when pressing the magnetic core 10. In such an embodiment example, the magnetic core 10 is formed integrally with the bridge element 20. The assembly costs of the bridge element 20 on the magnetic core 10 can thus be advantageously saved, and the magnetic component 1 can be designed so as to be advantageously compact and stable.

If no discrete gap 15 is designed as an air gap of the magnetic core 10 in the magnetic core 10, but rather if the magnetic core 10 comprises a distributed air gap, i.e. the magnetic core 10 itself is correspondingly designed to have low permeability, a highly permeable bridge element 20 can be arranged with an electrical measuring line 30 on such a magnetic core 10. Also in a magnetic component 1 designed in this way, the magnetic flux will flow through the highly permeable bridge element 20 for small load currents and will thus generate a voltage in the electrical measuring conductor 30, the so-called sense voltage. As soon as the bridge element 20 saturates, no voltage is induced in the electrical measuring conductor.

The electrical measuring conductor 30 surrounds the bridge element 20. For this purpose, the measuring conductor 30 is wound around a part of the bridge element 20. The electrical measuring conductor 30 can be wound in one winding turn around the part of the bridge element 20. However, the electrical measuring conductor 30 can also be wound around the part of the bridge element 20 in multiple winding turns. The electrical measuring conductor 30 is arranged in the region of the gap 15. The measuring conductor 30 surrounds the part of the bridge element 20 in the region of the gap where the bridge element 20 bridges the gap 15 in the magnetic core 10. In this region, the measuring conductor 30 is wound around the part of the bridge element 20. As in the embodiment example shown in the figures, the measuring conductor can be partially arranged in the gap 15.

As shown in the figures, the measuring conductor 30 can be arranged, in particular wound, through a recess 25 around a part of the bridge element 20, in particular around a web 26 of the bridge element 20. The electrical measuring conductor 30 is designed as an electrically conductive wire and can, for example, be designed as an insulated copper wire.

For example, the electrical measuring conductor 30 is also referred to as a sense coil. The electrical measuring conductor 30 is designed in order to measure a zero current in the electrical conductor 6 surrounding the annular core 10. For small load currents in the electrical conductor 6, the magnetic flux at least partially flows over the bridge element 20 and not over the air gap, due to the smaller magnetic impedance. By changing the magnetic flux in the bridge element 20, a voltage in the electrical measuring conductor 30 is induced in this phase. The characteristic voltage peak results in the zero current. If the magnetic flux is greater, the bridge element 20 saturates and the magnetic flux flows over the air gap of the magnetic core 10. As a result, there is only little or no further change in the magnetic flux in the bridge element 20, and no or only low voltage is induced in the electrical measuring conductor 30. The voltage signal induced in the electrical measuring conductor 30 of the control unit of the electronics can be transmitted by means of a suitable evaluation circuit.

Figure 6:
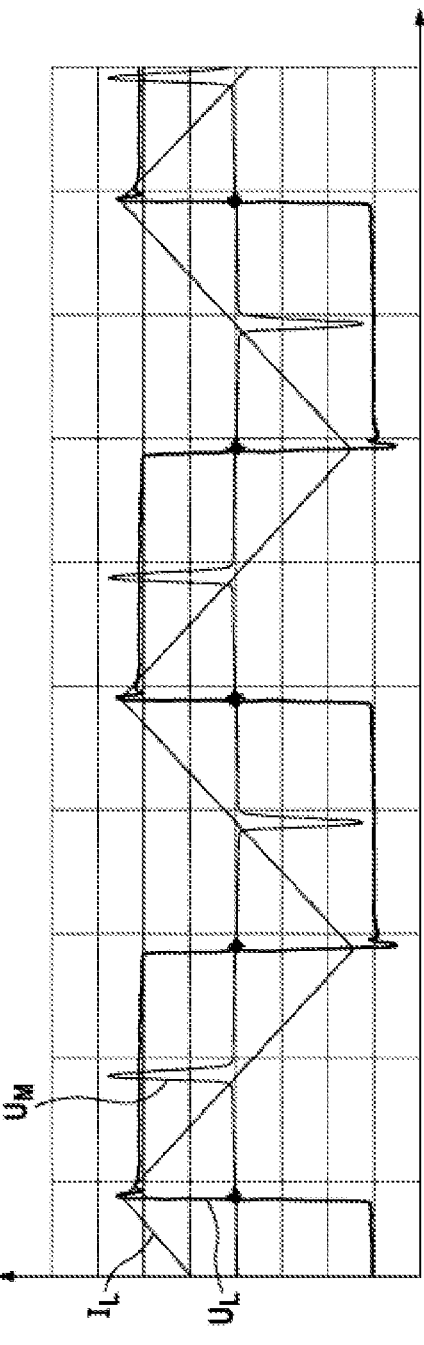

FIG. 6 shows an exemplary measurement curve of the zero current on the magnetic component 1, in which a square voltage $U_L$ has been applied to the electrical conductor 6 wound around the magnetic core 1 and the voltage $U_M$ has been measured on the electrical measuring conductor 30 wound around the bridge element 20. At the same time, the current $I_L$ has been measured in the electrical conductor 6. The current $I_L$ is alternating, so changes the current direction changes and takes on positive and negative values in alternation. The zero current refers to the time at which the current $I_L$ changes sign due to the electrical conductor 6. The voltage $U_M$ on the electrical measuring line 30 shows the characteristic peak in the range of the zero current of the current $I_L$.

Of course, further embodiment examples and mixed forms of the illustrated embodiment examples are also possible.

The invention claimed is:

1. A magnetic component for an electrical and/or electronic module, the magnetic component comprising a magnetic core and an electrical conductor surrounding the magnetic core, wherein a bridge element is arranged on the magnetic core, wherein at least a part of the bridge element is surrounded by an electrical measuring conductor, wherein the electrical measuring conductor is configured to measure a zero current in the electrical conductor surrounding the magnetic core, wherein at least one gap is formed in the magnetic core, wherein the at least one gap in the magnetic core is bridged by the bridge element, and wherein the electrical measuring conductor surrounds at least a part of the bridge element in a region of the at least one gap.

2. The magnetic component according to claim 1, wherein a material of the bridge element has a relative magnetic permeability count of more than 500.

3. The magnetic component according to claim 1, wherein the magnetic core has an axial direction and a central annular opening, and wherein a first annular surface and a second annular surface facing away from the first annular surface are configured on the magnetic core.

4. The magnetic component according to claim 3, wherein the bridge element is arranged on the magnetic core on the first annular surface of the magnetic core.

5. The magnetic component according to claim 4, wherein the electrical measuring conductor extends at least partially in the at least one gap.

6. The magnetic component according to claim 1, wherein the magnetic core has an axial direction and the at least one gap extends in the axial direction and in a radial direction perpendicular to the axial direction.

7. The magnetic component according to claim 1, wherein the bridge element is configured as a film or as a small plate.

8. The magnetic component according to claim 1, wherein a recess is configured in the bridge element in the region of the at least one gap, wherein the electrical measuring conductor extends through the recess in the bridge element.

9. The magnetic component according to claim 1, wherein the bridge element is tapered in a region in which the bridge element is surrounded by the electrical measuring conductor.

10. The magnetic component according to claim 1, wherein the magnetic component further comprises a further electrical conductor surrounding the magnetic core, wherein the magnetic core, together with the electrical conductor and the further electrical conductor, forms a transformer.

11. The magnetic component according to claim 1, wherein a material of the bridge element has a relative magnetic permeability count of more than 1000.

12. The magnetic component according to claim 1, wherein a material of the bridge element has a relative magnetic permeability count of more than 2000.

13. The magnetic component according to claim 1, wherein the electrical measuring conductor extends at least partially in the at least one gap.

14. A magnetic component for an electrical and/or electronic module, the magnetic component comprising a magnetic core, an electrical conductor surrounding the magnetic core, and a further electrical conductor surrounding the magnetic core, wherein a bridge element is arranged on the magnetic core, wherein at least a part of the bridge element is surrounded by an electrical measuring conductor, wherein the electrical measuring conductor is configured to measure a zero current in the electrical conductor surrounding the magnetic core, and wherein the magnetic core, together with the electrical conductor and the further electrical conductor, forms a transformer.

15. A magnetic component for an electrical and/or electronic module, the magnetic component comprising a magnetic core and an electrical conductor surrounding the magnetic core, wherein a bridge element is arranged on the magnetic core, wherein at least a part of the bridge element is surrounded by an electrical measuring conductor, wherein the electrical measuring conductor is configured to measure a zero current in the electrical conductor surrounding the magnetic core, and wherein the bridge element is tapered in a region in which the bridge element is surrounded by the electrical measuring conductor.

* * * * *